United States Patent [19]
Yoon et al.

[11] Patent Number: 5,885,847
[45] Date of Patent: Mar. 23, 1999

[54] METHOD OF FABRICATING A COMPOUND SEMICONDUCTOR DEVICE

[75] Inventors: Hyung-Sup Yoon; Jin-Hee Lee; Byung-Sun Park; Chul-Sun Park; Kwang-Eui Pyun, all of Daejeon, Rep. of Korea

[73] Assignee: Electronics And Telecommunications Research Institute, Daejon, Rep. of Korea

[21] Appl. No.: 835,957

[22] Filed: Apr. 11, 1997

[30] Foreign Application Priority Data

Dec. 6, 1996 [KR] Rep. of Korea ............... 96-62621

[51] Int. Cl.⁶ ............... H01L 21/00; H01L 21/338
[52] U.S. Cl. ............... 438/59; 438/94; 438/172; 438/175
[58] Field of Search ............... 438/172, 167, 438/175, 94, 59, 39; 257/458, 184, 466, 195

[56] References Cited

U.S. PATENT DOCUMENTS 5,170,228  12/1992  Sasaki ............... 257/184
5,576,222  11/1996  Arai et al. ............... 437/4

FOREIGN PATENT DOCUMENTS 0 710 984 A1  5/1996  European Pat. Off. ....... H01L 27/06

OTHER PUBLICATIONS

Streit et al., "GaAa and InP Selective Molecular–Beam Epitaxy," J. Vac. Sci. Technol. B 13(2), pp. 771–773, Mar. 1995.

Hurm, V., et al. *1.3 μm monolithic integrated optoelectronic receiver using InGaAs MSM photodiode and A1GaAs/GaAs HEMTs grown on GaAs*, IEDM, pp. 935–937, 1994.

Zebda, Y., et al. *Monolithically integrated InP–Based front–end photoreceivers*, IEEE, vol. 38, No. 6, Jun. 1991, pp. 1324–1332.

*Primary Examiner*—Brian Dutton
*Attorney, Agent, or Firm*—Cohen, Pontani, Lieberman & Pavane

[57] ABSTRACT

The invention relates to a method of fabricating a compound semiconductor device by forming a first and a second compound semiconductor devices having a plurality of different epitaxial layers on a common semiconductor substrate. The method comprises the steps of sequentially forming a plurality of first epitaxial layers for manufacturing the first compound semiconductor device on the semiconductor substrate; forming a first insulating film pattern for defining an active region of the first compound semiconductor device; etching the plurality of first epitaxial layers using the first insulating film pattern as a mask; forming a second insulating film on the resultant structure; forming a sidewall insulating spacer on the sidewall of the active region of the first compound semiconductor device by dry etching the second insulating film; sequentially forming a plurality of second epitaxial layers for manufacturing the second compound semiconductor device on the portion from which the plurality of first epitaxial layers is etched back; forming each electrode of the first and second compound semiconductor devices; and forming an interconnection electrode interconnecting each electrode of the first and second compound semiconductor devices.

8 Claims, 4 Drawing Sheets

METHOD OF FABRICATING A COMPOUND SEMICONDUCTOR DEVICE

BACKGROUND OF THE INVENTION

1. Field of the Invention

The present invention relates to a method of fabricating a compound semiconductor device, and more particularly, to a method of fabricating a compound semiconductor device which can prevent the deterioration of the characteristics of the isolation between devices and a large step difference between two devices, when more than one semiconductor device type such as an optical device and an electron device are fabricated on a common semiconductor substrate.

2. Background of the Invention

Conventional method for fabricating more than one device type such as optical device and field effect transistor, for example, high electron mobility transistor(HEMT) on a common semiconductor substrate, comprises the steps of defining an active region of the device by wet etching an epitaxial substrate for field effect device using a single nitride film, and growing epitaxial layers for optical device by a molecular beam epitaxy(MBE) method under the condition that the sidewall of the active region formed by etching is exposed.

FIGS. 1A to 1F show a conventional method for fabricating optical device and field effect device on a semiconductor devices.

Specifically, FIG. 1A shows epitaxial layers for manufacturing the field effect device(HEMT) including a semi-insulating gallium arsenide(GaAs) substrate 1, a buffer layer 2, a sub-channel 3, a channel layer 4, a spacer layer 5, a Schottky layer 6 and an n-type GaAs ohmic layer 7.

Referring to FIG. 1B, epitaxial layers for manufacturing the optical device include an AlGaAs etch-stop layer 8, a buffer layer 9, an InGaAs absorption layer 10, an AlGaAs Schottky layer 11 and a GaAs Schottky layer 12 formed in order.

As shown in FIG. 1C, an insulating film pattern 13 is formed to define an active region of the optical device, and then the epitaxial substrate for optical device is etched to form a mesa by etching the GaAs Schottky layer 12, the AlGaAs Schottky layer 11, the InGaAs absorption layer 10, the buffer layer 9 and the etch-stop layer 8 in order, so as to form the active region of the optical device, and simultaneously the epitaxial layer in which HEMT will be located is exposed.

Referring to FIG. 1D, the epitaxial layers for HEMT device is etched in the order of the ohmic layer 7, the Schottky layer 6, the spacer layer 5, the channel layer 4, the sub-channel 3 and the buffer layer 2 to form a mesa, and then the insulating film pattern 13 is removed.

Referring to FIG. 1E, an ohmic electrode 14 is formed and the ohmic layer 7 is etched to form a recessed portion. And, a gate electrode 15 of HEMT is formed. FIG. 1E is a cross-sectional view taken in the direction of the gate electrode 15. Then, Schottky electrode 16 of the optical device (MSM photo diode) is formed, and an interconnection electrode 17 connecting the above two devices is formed. Thus, the optical device and the field effect device are formed on a common substrate as shown in FIG. 1F.

In the conventional method, as can be seen from FIG. 1F, the length of the interconnection electrode 17 connecting the optical device to the field effect device is so long that there are too many parasitic components, which leads the decrease of the reliability of the device. And, the mesa etching method for forming an isolation region brings about a loss of the active region. Thus, the integration of the devices is decreased. And, the large step difference between the two devices may lead cutting of the interconnection electrode 17. And, since the gate electrode 15 of the HEMT device is in contact with the channel layer 4 of the HEMT active layers, a passage of the leakage current is generated between a gate and a source or a drain, which results the problems including the deterioration of the electric characteristics.

SUMMARY OF THE INVENTION

It is an object of the present invention to provide a method of fabricating a compound semiconductor device which can prevent the deterioration of the characteristics of the isolation between two devices and a large step difference between the two devices, when more than one semiconductor device type such as an optical device and an electron device are fabricated on a common semiconductor substrate.

In order to accomplish the above object, the present invention provides the method comprising the steps of forming an epitaxial layers for the field effect device on a semiconductor substrate, forming an insulating film mask on the sidewall and the surface of the epitaxial layers for the field effect device after etching process, planarizing the substrate by growing an epitaxial layers for the optical device on the common substrate using a selective regrowth method, and forming more than one semiconductor device type on the common substrate.

In accordance with the present invention, there is provided a method of fabricating a compound semiconductor device by forming a first and a second compound semiconductor devices having a plurality of different epitaxial layers on a common semiconductor substrate, which comprising the steps of: sequentially forming a plurality of first epitaxial layers for manufacturing the first compound semiconductor device on the semiconductor substrate; forming a first insulating film pattern for defining an active region of the first compound semiconductor device; etching the plurality of first epitaxial layers using the first insulating film pattern as a mask; forming a second insulating film on the resultant structure; forming a sidewall insulating spacer on the sidewall of the active region of the first compound semiconductor device by dry etching the second insulating film; sequentially forming a plurality of second epitaxial layers for manufacturing the second compound semiconductor device on the portion from which the plurality of first epitaxial layers is etched back; forming each electrode of the first and second compound semiconductor devices; and forming an interconnection electrode interconnecting each electrode of the first and second compound semiconductor devices.

BRIEF DESCRIPTION OF THE DRAWINGS

The above and other objects and features of the present invention will become apparent from the following description of preferred embodiments, when taken in conjunction with the accompanying drawings, in which.

DETAILED DESCRIPTION OF THE PREFERRED EMBODIMENTS

In FIG. 2A to 2F, an optical device(MSM photo diode) and a field effect device(HEMT) are fabricated on a common substrate. It will be apparent to those skilled in the art that the present invention may be applied to a process for fabricating a field effect gallium arsenide compound semiconductor device such as MESFET, electron device such as a heterojunction bipolar transistor(HBT), and an optical device such as semiconductor laser or photo diode, instead of HEMT and the optical device described above.

Figure 1A:
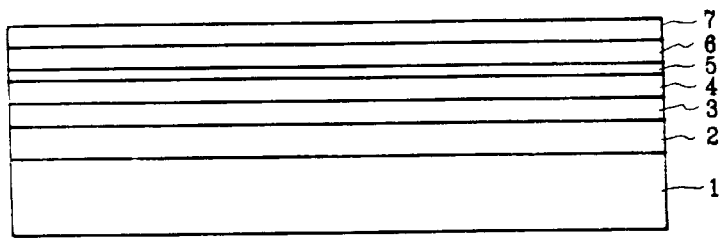
FIG. 1A to 1F show cross-sectional views of a developing structures for fabricating an optical device and a field effect device on a common substrate according to the prior art.
Figure 1B:
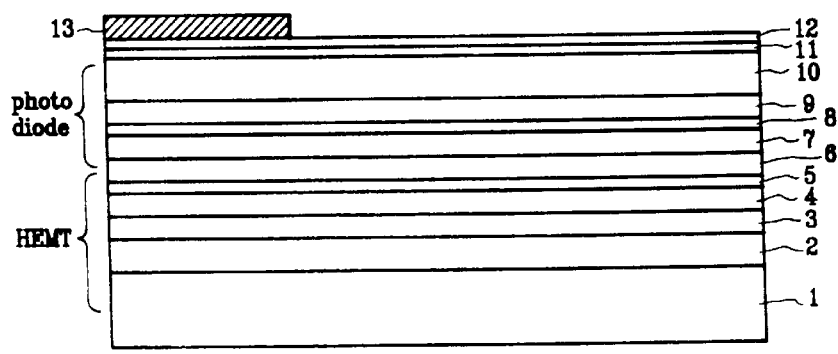
Figure 1C:
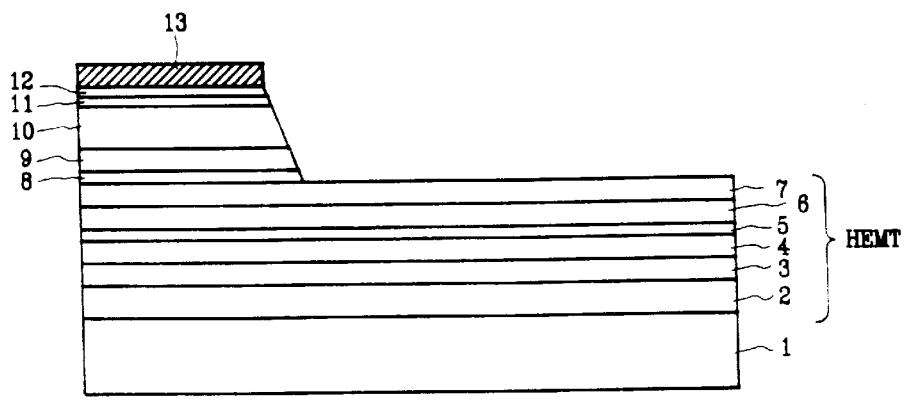
Figure 1D:
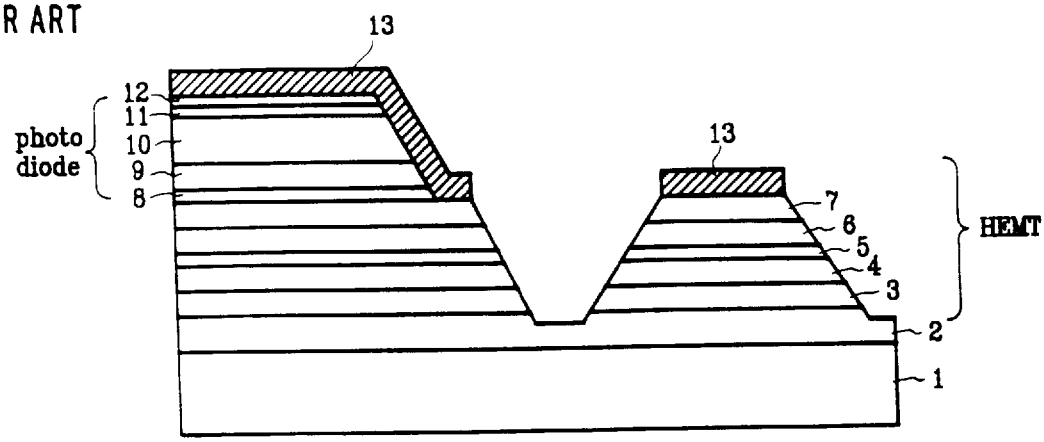
Figure 1E:
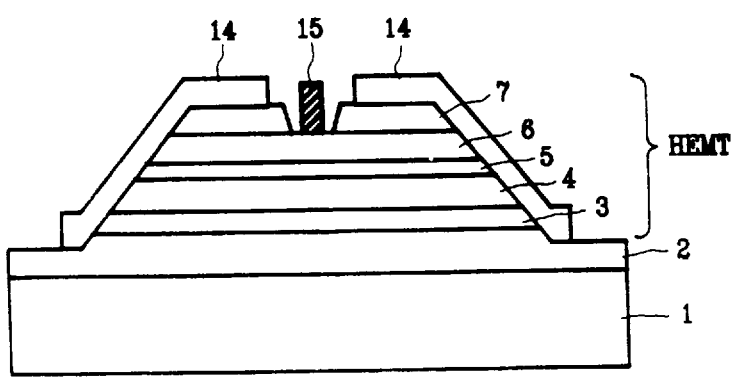
Figure 1F:
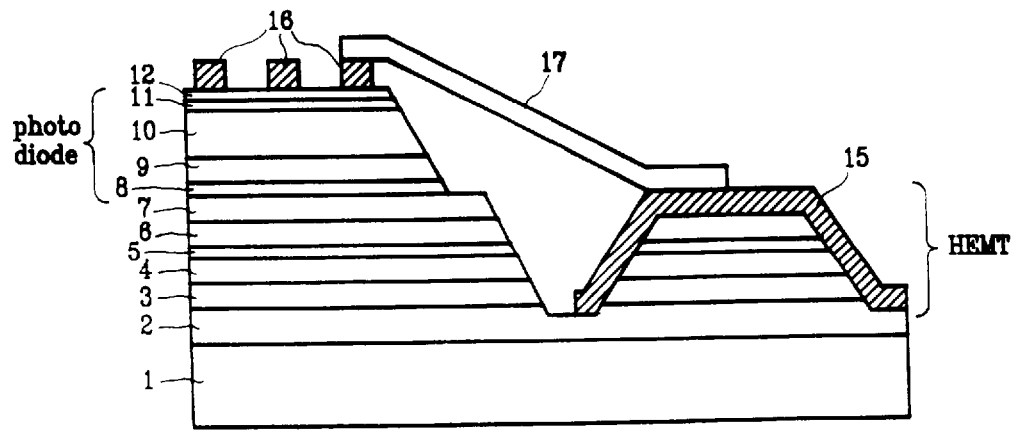
Figure 2A:
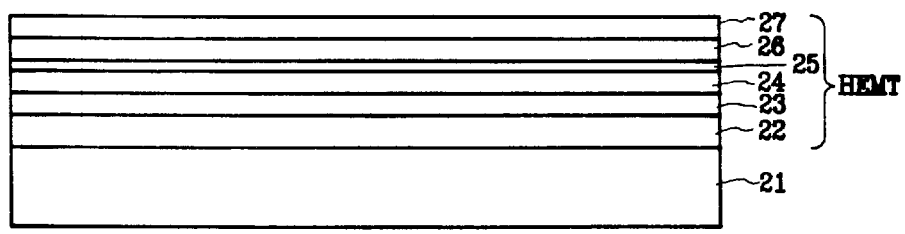
FIG. 2A to 2F show cross-sectional views of a developing structures for fabricating an optical device and a field effect device on a common substrate according to the present invention.

FIG. 2A shows epitaxial layers for manufacturing the optical device and the field effect device, in which the numeral 21 indicates a semi-insulating gallium arsenide substrate, the numeral 22 indicates a buffer layer, the numeral 23 indicates a sub-channel layer, the numeral 24 indicates a channel layer, the numeral 25 indicates a spacer layer, the numeral 26 indicates a Schottky layer, and the numeral 27 indicates an n-type GaAs ohmic layer.

Figure 2B:
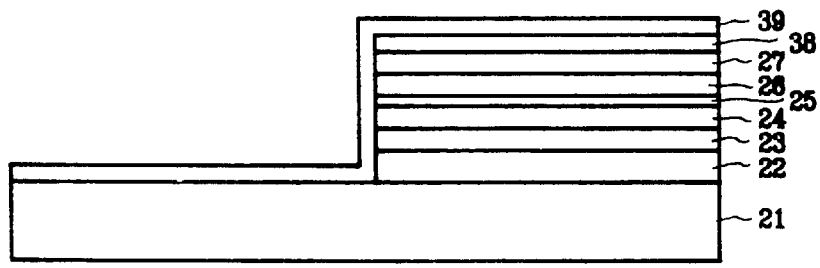

Referring to FIG. 2B, a double-layered insulating film pattern 38 composed of an oxide film and a nitride film is formed by a low temperature PECVD to define an active region of the HEMT device. And, the epitaxial layers are dry etched vertically by etching the ohmic layer 27, the Schottky layer 26, the spacer layer 25, the channel layer 24, the sub-channel 23, and the buffer layer 22 in order from the top, using the double-layered insulating film pattern 38 as a mask, and then a double-layered insulating film 39 composed of an oxide film and a nitride film is deposited.

Figure 2C:
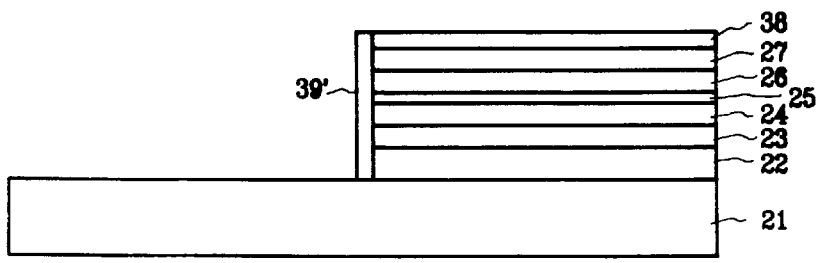

Referring to FIG. 2C, the double-layered insulating film 39 is dry etched all over its surface to form a sidewall spacer 39' of a double-layered insulating film on the sidewall of the HEMT device.

Figure 2D:
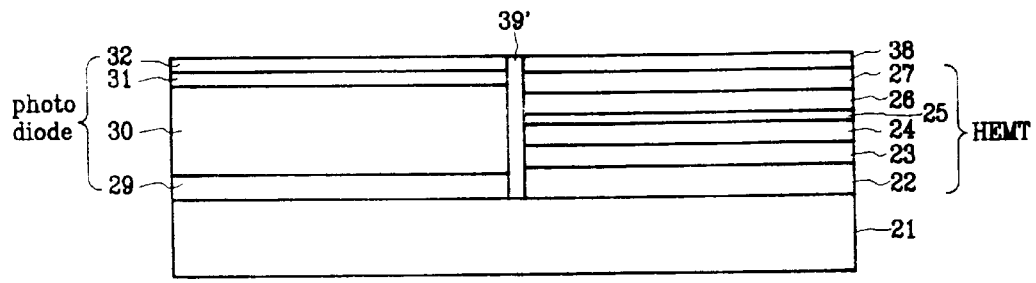

Referring to FIG. 2D, an epitaxial layers 29, 30, 31 and 32 for the optical device are selectively grown using the double-layered insulating film pattern 38 and the sidewall spacer 39' as a mask by a metal organic chemical vapor deposition (MOCVD) method, in which the numeral 29 indicates a buffer layer, the numeral 30 indicates an InGaAs absorption layer, the numeral 31 indicates an AlGaAs Schottky layer and the numeral 32 indicates a GaAs Schottky layer, respectively.

Figure 2E:
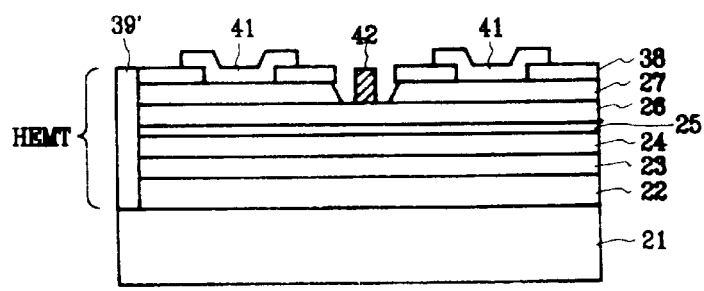

Referring to FIG. 2E, a portion of the double-layered insulating film 38 is removed and an n-type GaAs ohmic electrode 41 is formed in order to manufacture the HEMT device. And, the ohmic layer 27 is recessed partially by etching a portion of the ohmic layer 27, then a gate electrode 42 is formed on the recessed portion.

Figure 2F:
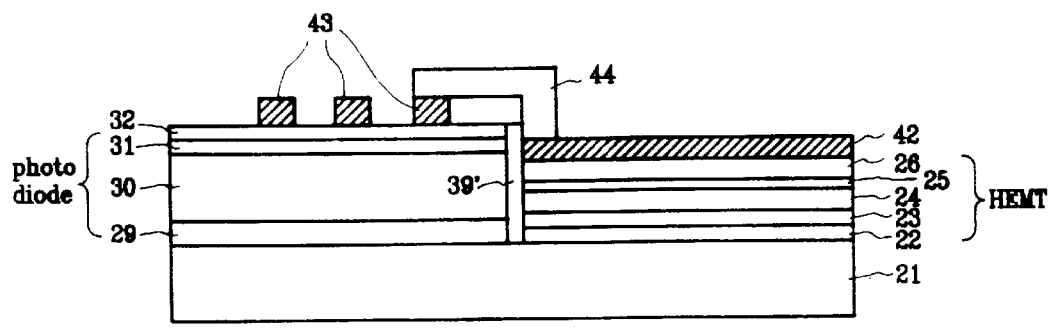

Referring to FIG. 2F, a Schottky electrode 43 for connecting the optical device is formed, and then an interconnection electrode 44 for connecting the optical device to the HEMT device is formed. As shown in FIG. 2F, the optical device and the field effect device having the structure of the good planarization characteristics can be formed on a common substrate, respectively.

Therefore, in the method of manufacturing the optical device and the field effect device according to the present invention as above, since the epitaxial substrate for the field effect device is mesa etched by a dry etching process and then the sidewall of the epitaxial layers are covered by a passivation layer of the double-layered insulating film, it is possible to prevent the devices from being inter-contaminated by impurities and being damaged during the growth of the epitaxial layers for the optical device is under way. Thus, the property of the crystal of the epitaxial layers can be improved. And, since the spacer of the insulating film formed in the sidewall of the patterned epitaxial layer provides the isolation effect, so that the area of the isolation region can be decreased and the integration of the semiconductor device can be increased in comparison with the conventional mesa isolation method. Further, the distance of the interconnection between two devices is shortened, so that the electric characteristics can be improved. And, the active layers are covered by the passivation layer of the double-layered sidewall spacer and the gate electrode is completely separated from the active layers, thus the electric characteristics of the device can be improved.

As described above, although the present invention has been described in detail with reference to illustrative embodiments, the invention is not limited thereto and various modifications and changes may be effected by one skilled in the art within the scope of the invention.

What is claimed is:

1. A method of fabricating a compound semiconductor device by forming first and second compound semiconductor devices having a plurality of different epitaxial layers on a common semiconductor substrate, which comprising the steps of:

sequentially forming a plurality of first epitaxial layers for manufacturing the first compound semiconductor device on the semiconductor substrate;

forming a first insulating film pattern for defining an active region of the first compound semiconductor device;

etching the plurality of first epitaxial layers using the first insulating film pattern as a mask to form a resulant structure;

forming a second insulating film on the resultant structure;

forming a sidewall insulating spacer on the sidewall of the active region of the first compound semiconductor device by dry etching the second insulating film;

sequentially forming a plurality of second epitaxial layers for manufacturing the second compound semiconductor device on the portion from which the plurality of first epitaxial layers are etched back;

forming each electrode of the first and second compound semiconductor devices; and forming an interconnection electrode interconnecting said each electrode of the first and second compound semiconductor devices.

2. The method of claim 1, wherein the first compound semiconductor device is a HEMT device and the second compound semiconductor device is a photo diode.

3. The method of claim 1, wherein the plurality of first epitaxial layers includes a buffer layer, a sub-channel layer, a channel layer, a spacer layer, a Schottky layer and an ohmic layer.

4. The method of claim 1, wherein the plurality of second epitaxial layers includes a buffer layer, an InGaAs absorption layer, an AlGaAs Schottky layer and a GaAs Schottky layer.

5. The method of claim 1, wherein the step of forming each electrode of the first and second compound semiconductor device comprising the step of:

forming an ohmic electrode of the first compound semiconductor device after removing a portion of the first insulating film pattern.

6. The method of claim 1, wherein the first and second insulating films each are a double-layered insulating film composed of an oxide film and a nitride film.

7. The method of claim 2, wherein the plurality of first epitaxial layers includes a buffer layer, a sub-channel layer, a channel layer, a spacer layer, a Schottky layer and an ohmic layer.

8. The method of claim 2, wherein the plurality of second epitaxial layers includes a buffer layer, an InGaAs absorption layer, an AlGaAs Schottky layer and a GaAs Schottky layer.

* * * * *